United States Patent
Mirabella

(10) Patent No.: US 10,319,686 B2
(45) Date of Patent: Jun. 11, 2019

(54) RADIATION-HARD ELECTRONIC DEVICE AND METHOD FOR PROTECTING AN ELECTRONIC DEVICE FROM IONIZING RADIATION

(71) Applicant: STMicroelectronics S.R.L., Agrate Brianza (IT)

(72) Inventor: Ignazio Bruno Mirabella, Scicli (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/198,877

(22) Filed: Jun. 30, 2016

(65) Prior Publication Data
US 2017/0141048 A1    May 18, 2017

(30) Foreign Application Priority Data
Nov. 18, 2015   (IT) .......................... 102015000074005

(51) Int. Cl.
| | |
|---|---|
| *H01L 23/552* | (2006.01) |
| *H01L 23/29* | (2006.01) |
| *H01L 23/24* | (2006.01) |
| *H01L 21/54* | (2006.01) |
| *H01L 23/556* | (2006.01) |

(Continued)

(52) U.S. Cl.
CPC ............ *H01L 23/556* (2013.01); *H01L 21/54* (2013.01); *H01L 23/24* (2013.01); *H01L 23/552* (2013.01); *B29C 2043/181* (2013.01); *H01L 23/053* (2013.01); *H01L 23/296* (2013.01); *H01L 27/1203* (2013.01);

(Continued)

(58) Field of Classification Search
CPC ... H01L 23/556; H01L 23/552; H01L 23/053; H01L 21/54; H01L 23/296; H01L 23/24; H01L 27/1203; H01L 2224/48091
See application file for complete search history.

(56) References Cited

U.S. PATENT DOCUMENTS

| | | | |
|---|---|---|---|
| 4,523,371 A | | 6/1985 | Wakashima |
| 4,975,762 A | * | 12/1990 | Stradley ................ H01L 23/556 |
| | | | 257/660 |

(Continued)

FOREIGN PATENT DOCUMENTS

| | | |
|---|---|---|
| JP | 57-90966 A | 6/1982 |
| JP | 58-223352 A | 12/1983 |

(Continued)

OTHER PUBLICATIONS

ASTM, "Standard Guide for the Measurement of Single Event Phenomena (SEP) Induced by Heavy Ion Irradiation of Semiconductor Devices," Designation: F 1192-00, ASTM International, West Conshohocken, PA, 2000, 11 pgs.

(Continued)

*Primary Examiner* — Caridad Everhart
(74) *Attorney, Agent, or Firm* — Seed IP Law Group LLP

(57) ABSTRACT

A radiation-hard electronic device including a package structure, a semiconductor chip in a cavity within the package structure, an integrated circuit in the semiconductor chip, and structures for protection from radiation for protecting the integrated circuit from ionizing radiation. The structures for protection from radiation include a protective layer of gel, which occupies at least in part the cavity and coats the semiconductor chip.

18 Claims, 3 Drawing Sheets

(51) Int. Cl.
*H01L 23/053* (2006.01)
*H01L 27/12* (2006.01)
*B29C 43/18* (2006.01)

(52) U.S. Cl.
CPC ............ *H01L 2224/48091* (2013.01); *H01L 2224/73265* (2013.01); *H01L 2924/181* (2013.01)

(56) References Cited

U.S. PATENT DOCUMENTS

| | | | | |
|---|---|---|---|---|
| 5,008,733 | A * | 4/1991 | Mine | H01L 23/057 257/702 |
| 5,137,837 | A * | 8/1992 | Chang | H01L 21/76224 257/E21.546 |
| 5,700,697 | A * | 12/1997 | Dlugokecki | H01L 21/56 257/E21.502 |
| 5,998,867 | A * | 12/1999 | Jensen | H01L 23/3135 174/104 |
| 2006/0102988 | A1 | 5/2006 | Tolchinsky | H01L 21/76243 257/635 |
| 2008/0296519 | A1 * | 12/2008 | Larsen | G21F 1/00 250/515.1 |
| 2009/0008673 | A1 * | 1/2009 | Kato | C08G 77/04 257/100 |
| 2010/0237389 | A1 * | 9/2010 | Hakey | H01L 21/84 257/213 |
| 2012/0146232 | A1 | 6/2012 | Umemura et al. | |
| 2014/0021503 | A1 * | 1/2014 | Yoshida | H01L 33/507 257/98 |
| 2016/0096984 | A1 * | 4/2016 | Matsumoto | C08L 83/04 252/75 |
| 2017/0110492 | A1 * | 4/2017 | Gordon | G01T 1/026 |

FOREIGN PATENT DOCUMENTS

| | | | | |
|---|---|---|---|---|
| JP | 63157428 | * | 6/1988 | ............ H01L 27/10 |
| JP | 63232340 | * | 9/1988 | ............ H01L 21/52 |

OTHER PUBLICATIONS

European Cooperation for Space Standardization, "Space engineering—Calculation of radiation and its effects and margin policy handbook," ECSS-E-HB-10-12A, ECSS Secretariat, ESA-2 ESTEC, Requirements & Standards Division, Noordwijk, The Netherlands, Dec. 17, 2010, 122 pages.

European Space Agency, "Single Event Effects Test Method and Guidelines," ESA/SCC Basic Specification No. 25100, Space Components Coordination Group, Oct. 1995, 23 pages.

* cited by examiner

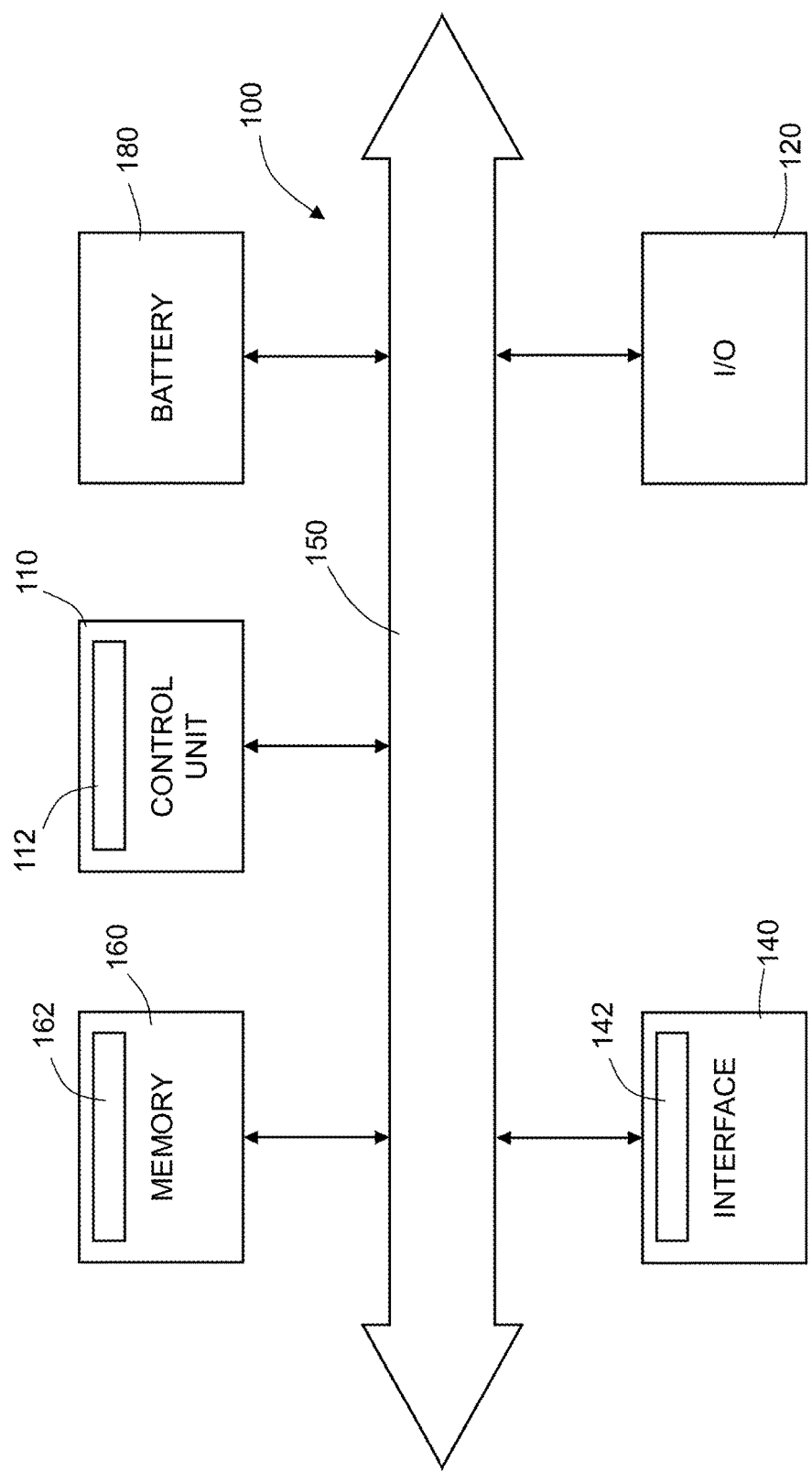

RADIATION-HARD ELECTRONIC DEVICE AND METHOD FOR PROTECTING AN ELECTRONIC DEVICE FROM IONIZING RADIATION

BACKGROUND

Technical Field

The present disclosure relates to a radiation-hard electronic device and to a method for protecting an electronic device from ionizing radiation.

Description of the Related Art

As is known, electronic devices may generally undergo damage of a various nature and seriousness from exposure to ionizing radiation. Damage may derive both from the total dose of radiation absorbed and from single events, and may range from a disturbance of a minor degree to a catastrophic breakdown, which causes destruction of the devices.

Damage deriving from the total dose of radiation absorbed presents progressively and usually may be put down to phenomena of trapping of the charge generated by interaction with the incident radiation. A typical effect is drift of the threshold voltages of MOS transistors as a result of the charge trapped in the gate insulating regions.

Single events are instead due to impact of high-energy particles on the semiconductor substrates in which the devices are formed. Interaction with the substrate gives rise to an intense generation of charge carriers along the paths of the high-energy particles. In turn, the charge carriers are at the origin of drift and diffusion currents that may cause phenomena equivalent to electrostatic discharge, such as triggering of parasitic components or the phenomena of junction breakdown. In some conditions, the phenomena may have intensities such as to cause permanent damage to, or even destruction of, the devices.

Devices designed for operating in environments exposed to ionizing radiation should evidently be provided with protection structures or arrangements that enable mitigation of the adverse effects both of accumulation of radiation doses over time and of single events. Operating conditions that require adoption of measures against damage from ionizing radiation are encountered regularly in space applications (e.g., satellites, spacecraft, space stations) or else in nuclear sites.

The structural, circuit, and process solutions adopted for preserving devices from radiation offer a certain degree of protection, but not always are sufficiently robust to prevent malfunctioning and breakdown, especially in critical applications.

It would thus be desirable to have available more effective protection systems for reducing the risk of temporary and/or permanent damage of electronic devices.

BRIEF SUMMARY

The present disclosure provides a radiation-hard electronic device and a method for protecting an electronic device from ionizing radiation that will enable some or all of the limitations described above to be overcome or at least attenuated.

According to embodiments of the present disclosure, a radiation-hard electronic device and a method for protecting an electronic device from ionizing radiation are provided.

BRIEF DESCRIPTION OF THE SEVERAL VIEWS OF THE DRAWINGS

For a better understanding of the disclosure, embodiments thereof will now be described, purely by way of non-limiting example and with reference to the attached drawings, wherein:

FIG. 6 is a simplified block diagram of an electronic system incorporating at least one electronic device according to embodiments of the present disclosure.

DETAILED DESCRIPTION

Figure 1:
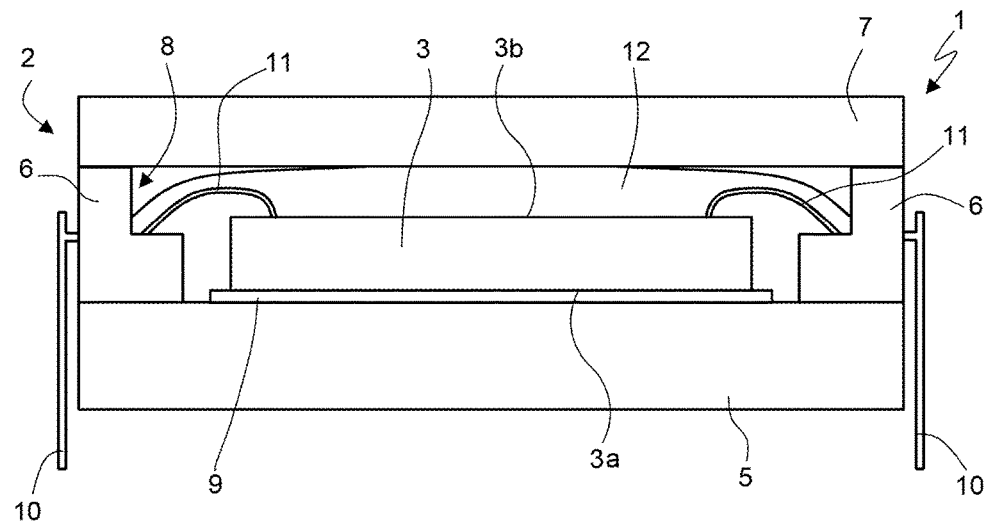
FIG. 1 is a simplified cross-section through an electronic device according to an embodiment of the present disclosure.

With reference to FIG. 1, a radiation-hard electronic semiconductor device according to one embodiment of the present disclosure is designated as a whole by 1 and comprises a package structure 2 and a semiconductor chip 3 integrated in which are electronic components (here not illustrated).

The electronic semiconductor device 1 is provided with structures for protection from radiation at the level of the package structure 2 and of the semiconductor chip 3. The package structure 2 itself is of the flat-hermetic-package type, which is particularly suited to offering protection from radiation because it has a high lead density.

The package structure 2 comprises a ceramic substrate 5, a frame-like spacer structure 6, and a cover 7. The spacer structure 6 is arranged between the ceramic substrate 5 and the cover 7 and delimits laterally a cavity 8 housed in which is the semiconductor chip 3. The semiconductor chip 3 is bonded to the ceramic substrate 5 by a bonding layer 9 and is coupled to external contacts 10 by wire bonds 11.

The semiconductor chip 3 is coated by a protective layer 12 of gel, which incorporates also the wire bonds 11. The protective layer 12, which forms part of the protection structures, fills the cavity 8 at least partially, surrounding the semiconductor chip 3 on all sides, except obviously for the lower face 3a bonded to the ceramic substrate 5. The portion of the protective layer 12 that coats the free face 3b of the semiconductor chip 3 has a thickness not greater than 700 µm. The gel that forms the protective layer 12 is a silicone gel and, in one embodiment, contains hydrogen. The cover 7 seals the cavity 8.

The protective layer 12 may advantageously be deposited in low-pressure conditions (for example, at 50 mbar) to prevent formation of bubbles that might reduce the effectiveness of the protection.

Figure 2:
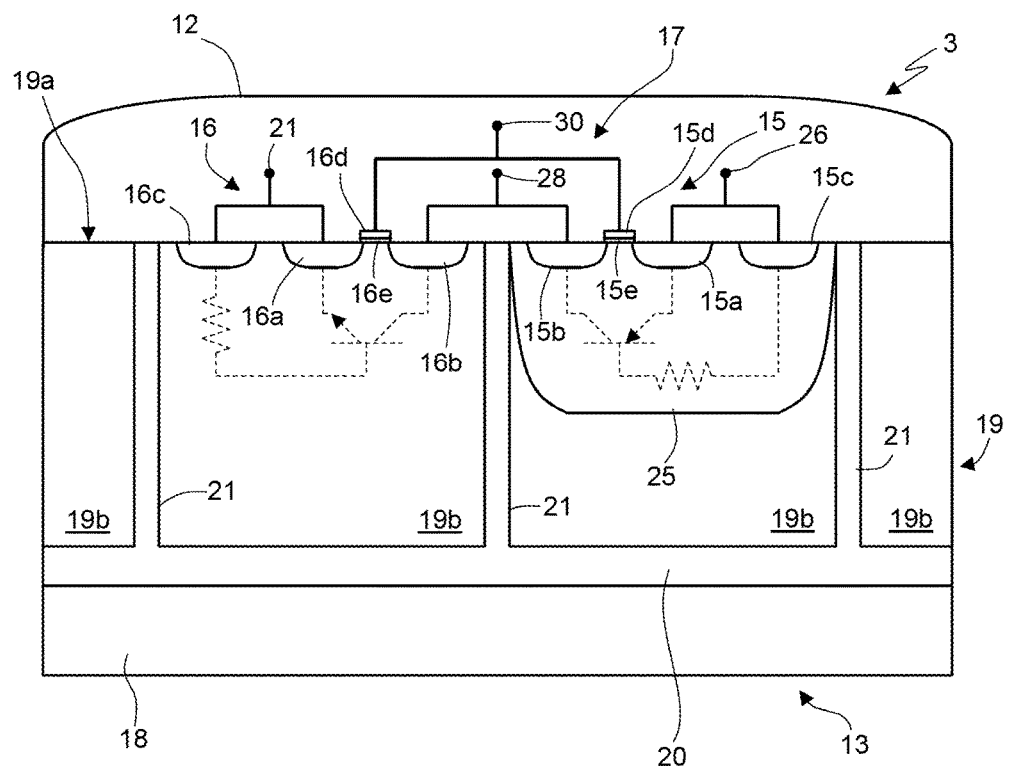
FIG. 2 is a cross-section of an enlarged detail of the device of FIG. 1.

With reference to FIG. 2, the semiconductor chip 3 is provided with further structures for protection from radiation and comprises a substrate 13, of a SOI type, and electronic components 15, 16, which are housed in the substrate 13 and form an integrated circuit 17. The integrated circuit 17 may be of any type and may perform any function. In particular, the integrated circuit 17 may be an analog circuit (by way of non-limiting example, an amplifier, a filter, or a power supply), a digital circuit (by way of non-limiting example, a logic circuit or a memory), a low-voltage circuit, or a power circuit.

Figure 3:
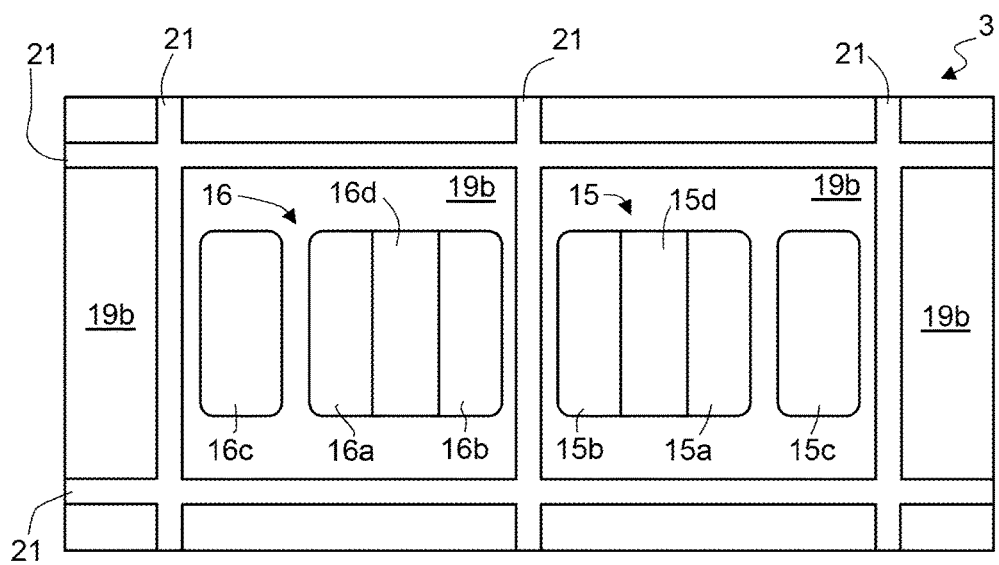
FIG. 3 is a top plan view of the detail of FIG. 2.

The substrate 13, as mentioned above, is of a SOI type and comprises a first semiconductor layer 18 and a second semiconductor layer 19, for example of a P type, separated and insulated from one another by a dielectric layer 20. Further, the substrate 13 comprises trench-insulation structures 21 that extend from a face 19a of the second semiconductor layer 19 as far as the dielectric layer 20 through the entire second semiconductor layer 19. The trench-insulation structures 21 are bonded to the dielectric layer 20 and delimit laterally respective portions or cells 19b of the second semiconductor layer 19, electrically insulated from the other cells 19b and from the remaining portions of the second semiconductor layer 19 (see also FIG. 3). The dielectric layer 20 and the trench-insulation structures 21 form a structure for protection from radiation, in particular from isolated latch-up events, as clarified hereinafter.

Represented by way of example in FIG. 2 are a PMOS transistor 15 and an NMOS transistor 16 of a circuit obtained in CMOS technology, which are formed in respective cells 19b of the second semiconductor layer 19 and are operatively coupled to one another.

The PMOS transistor 15 is provided in a body well 25 of an N type and comprises a source region 15a, a drain region 15b, both of a P type, and a body-contact region 15c, of an N type. A polysilicon gate region 15d is separated from the body well 25 by a gate-oxide region 15e and extends between the source region 15a and the drain region 15b. The gate-oxide region 15e has a thickness of less than 7 nm for minimizing the accumulation of charge trapped as a result of ionizing radiation.

The NMOS transistor 16 comprises a source region 16a, and a drain region 16b, both of an N type, and a body-contact region 16c, of a P type. A polysilicon gate region 16d is separated from the second semiconductor layer 19 by a gate-oxide region 16e and extends between the source region 16a and the drain region 16b. Also the gate-oxide region 16e has a thickness of less than 7 nm.

The source region 15a and the body-contact region 15c of the PMOS transistor 15 are connected to a first power-supply line 26, for example a positive supply line. The source region 16a and the body-contact region 16c of the NMOS transistor 15 are connected to a second power-supply line 27, for example a negative supply line. The drain regions 15b, 16b of the PMOS transistor 15 and of the NMOS transistor 16 are connected to a common output terminal 28. The gate regions 15d, 16d of the PMOS transistor 15 and of the NMOS transistor 16 are connected to a common input terminal 30.

Represented with a dashed line in FIG. 2 are also parasitic components, in particular a parasitic PNP transistor in the cell 19b of the PMOS transistor 15 and a parasitic NPN transistor in the cell 19b of the NMOS transistor 16. Thanks to the insulation provided by the structure for protection from radiation defined by the dielectric layer 20 and by the trench-insulation structures 21, any accidental triggering of the parasitic components as a result of incident ionizing radiation is prevented from being stabilized by the passage of currents through the second semiconductor layer 19. In practice, the structure for protection from radiation defined by the dielectric layer 20 and by the trench-insulation structures 21 breaks up the parasitic thyristors typical of circuits in CMOS technology.

Other measures of protection from radiation integrated in the semiconductor chip 3 may regard:

auxiliary circuits that prevent triggering of parasitic components;

circuits for detection and correction of errors;

circuits for compensation of the thresholds;

redundant circuits; and circuits with modular redundancy or with voting logic so that different identical circuits perform the same function, the outputs are compared, and, in the case of disagreement, the output supplied by the majority of the circuits is selected.

The electronic device 1 described integrates various protection structures at the level of the package structure 2 and at the level of the semiconductor chip 3 that enable mitigation of the harmful effects of ionizing radiation.

Use of the protective layer 12 of silicone gel, in particular, enables significant reduction of the energy of the incident particles and consequent attenuation of the effects of collisions. In particular, the protective layer 12 of silicone gel has proven effective in preventing damage deriving from single events of the so-called "snap-back" type, from which also the devices made in SOI substrates might otherwise be affected. When a high-energy particle impinges on a semiconductor substrate, the interaction with the atoms of the lattice gives rise to an intense generation of charge carrier pairs along the path of the particle itself. Part of the charge produced is removed very rapidly by a drift mechanism, in particular when the collision affects a reversely biased PN junction. The drift mechanism depends upon the modifications of the electrical field at the PN junction following upon collision of ionizing particles and gives rise to currents that tend to vanish rapidly, but reach very high intensity peaks and represent a serious risk of damage (see the current profiles illustrated in the graph of FIG. 4, in particular in the initial portion on the left). In a MOS transistor, for example, activation of parasitic components resulting from isolated snap-back events may cause a short circuit between the drain and source regions also in circuits obtained in SOI substrates. In this case, damage and the current intensity may depend also upon the drain-to-source voltage. In practice, the higher the drain-to-source voltage, the lower the robustness in regard to damage from ionizing radiation. Another fraction of charge gives instead rise to diffusion currents and tends to recombine. The contribution of drift current vanishes more slowly (right-hand part of the graph of FIG. 4), but does not reach high values and generally represents a lower risk.

Figure 4:
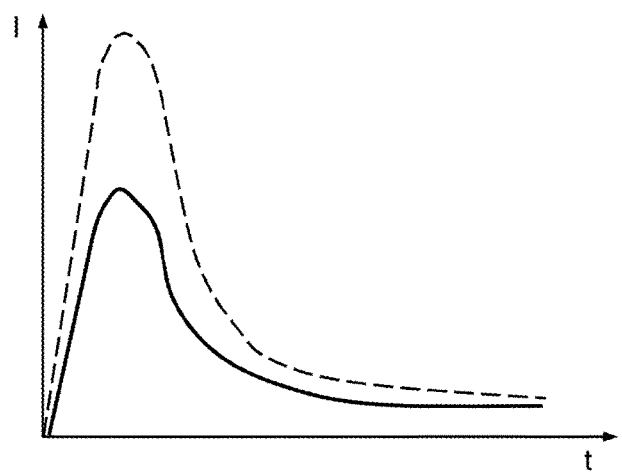
FIG. 4 is a graph that shows first quantities corresponding to the device of FIG. 1 and to a known device.

The use of the protective layer 12 of silicone gel enables drastic attenuation of the energy of the incident particles and reduces accordingly both generation of charge carriers pairs and the intensity of the current deriving from collision, in particular the drift current. In the graph of FIG. 4, the top dashed line and the solid line represent the currents induced from ionizing radiation in the absence and in the presence, respectively, of the protective layer 12 of silicone gel.

Figure 5:
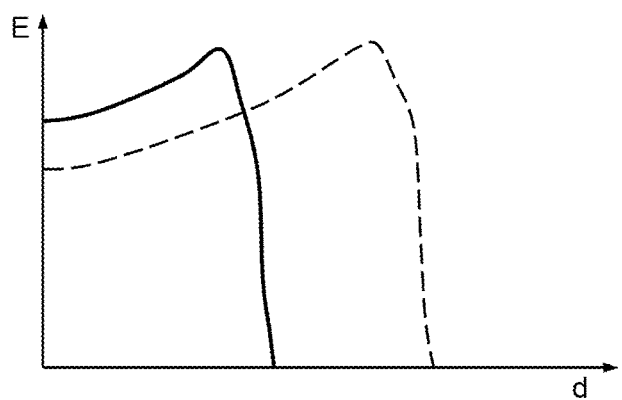
FIG. 5 is a graph that shows second quantities corresponding to the device of FIG. 1 and to a known device.

Tests have also shown that the capacity of penetration of ionizing radiation within the semiconductor material is markedly reduced by the presence of the protective layer 12. FIG. 5 shows the linear transfer of energy as a function of the depth of penetration of ionizing particles within the semiconductor. In the graph, the dashed line regards a device without protection with layers of gel, whereas the solid line regards the electronic device 1 provided with protective layer 12 of silicone gel. As emerges clearly, the energy transferred to the semiconductor is much lower in the presence of the protective layer 12. Consequently, also the generation of charge carriers pairs and the currents caused by impact of the ionizing particles are reduced accordingly, and thus likewise the risk of damage to the device. Given the same biasing conditions, the risk of damage may thus be reduced thanks to the protective layer 12. Conversely, the protective layer 12 enables use of devices of higher voltage classes without increasing the risk of damage, given the same exposure to ionizing radiation.

Advantageously, the protective layer 12 occupies a space normally left empty in conventional devices. The solution described thus enables marked improvement of the robustness of the electronic device 1 in regard to radiation, without affecting the structure and the overall dimensions. Further, the silicone gel may be deposited or dispensed easily, and the step of formation of the protective layer may be integrated in the normal process flows, in particular in the steps of packaging of the semiconductor chip 3. Integration of the protective layer 12 of silicone gel is thus also far from costly.

FIG. 6 illustrates a portion of an electronic system 100 according to one embodiment of the present disclosure. The system 100 may be used in, or in combination with, devices such as sensors, actuators, computers, possibly with wireless connection capacity, a mobile or satellite communication device, a digital camera, or other devices designed to process, store, transmit, or receive information.

The electronic system 100 may comprise a control unit 110, an input/output (I/O) device 120 (for example, a keyboard or a display), a wireless interface 140 and a memory 160, of a volatile or non-volatile type, coupled together through a bus 150. In one embodiment, a battery 180 may be used for supplying the system 100. It should be noted that the scope of the present disclosure is not limited to embodiments having necessarily one or all of the devices listed.

The control unit 110, the wireless interface 140, and the memory 160 may be provided in distinct semiconductor chips or else some of these may be integrated in a same semiconductor chip. Further, one or more of the devices listed is incorporated in a package structure with a protective layer of silicone gel. Represented schematically by way of example in FIG. 6 are protective layers 112, 142, 162 for the control unit 110, the wireless interface 140, and the memory 160, respectively.

The control unit 110 may comprise, for example, one or more microprocessors, microcontrollers, and the like. Each of these may be incorporated in a package structure with a respective protective layer of silicone gel.

The I/O device 120 may be used for generating a message. The system 100 may use the wireless interface 140 for transmitting and receiving messages to and from a wireless communication network with a radiofrequency (RF) signal. Examples of wireless interface may comprise an antenna, a wireless transceiver, such as a dipole antenna, even though the scope of the present disclosure is not limited from this standpoint. Further, the I/O device 120 may supply a voltage representing what is stored either in the form of digital output (if digital information is stored) or in the form of analog output (if analog information is stored).

Finally, it is clear that modifications and variations may be made to the electronic device and to the method described, without thereby departing from the scope of the present disclosure, as defined in the annexed claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A radiation-hard electronic device, comprising:
  a package structure;
  a semiconductor chip in a cavity within the package structure and including a first face, a second face opposite the first face, and sides extending between the first and second faces, the semiconductor chip further including:
    a first semiconductor layer and a second semiconductor layer separated and insulated from one another by a dielectric layer; and
    trench-insulation structures which extend through the entire second semiconductor layer from the first face as far as the dielectric layer;
  an integrated circuit in the semiconductor chip; and
  a first radiation protection structure of a single protective layer of gel which occupies at least in part the cavity and coats the first face and sides of the semiconductor chip to protect the semiconductor chip from ionizing radiation, the single protective layer of gel being the only layer in the radiation-hard electronic device to significantly attenuate the energy of particles of ionizing radiation incident on the semiconductor chip.

2. The device according to claim 1 wherein the package structure contains lead.

3. The device according to claim 1 wherein the package structure is of a flat-hermetic-package type.

4. The device according to claim 1 wherein the semiconductor chip comprises a SOI substrate.

5. The device according to claim 1 wherein the gel is a silicone gel which occupies at least in part the cavity and coats the semiconductor chip.

6. The device according to claim 5, wherein the gel contains hydrogen.

7. The device according to claim 6 wherein a portion of the protective layer coating the semiconductor chip has a thickness not greater than 700 µm.

8. The device according to claim 1 wherein the trench-insulation structures are bonded to the dielectric layer and delimit laterally respective cells of the second semiconductor layer electrically insulated from remaining portions of the second semiconductor layer.

9. The device according to claim 8 further comprising a second protection structure formed by the dielectric layer and by the trench-insulation structures.

10. The device according to claim 8 wherein the integrated circuit comprises a first electronic component and a second electronic component, which are provided in respective and distinct cells of the second semiconductor layer and are operatively coupled to one another.

11. A system, comprising:
  a control unit; and
  an electronic device coupled to the control unit, wherein at least one between the control unit and the electronic device is protected from radiation through a structure including,
    a package structure including a substrate and a cover with a cavity formed between the substrate and the cover, the substrate having a surface exposed in the cavity;
    a semiconductor chip including a lower surface attached to the surface of the substrate exposed in the cavity, and including a free surface opposite the lower surface and a plurality of side surfaces extending between the lower and free surfaces, the free surface being exposed in the cavity;

an integrated circuit formed in the semiconductor chip; and a radiation protection structure of a silicone gel coating in the cavity and surrounding the free and side surfaces of the semiconductor chip but not the lower surface attached to the surface of the substrate, the silicone gel coating being in the cavity between the free surface of the semiconductor chip and the cover of the package structure, and the silicone gel coating being the only coating in the radiation protection structure configured to reduce drift currents generated in the semiconductor chip in response to particles of ionizing radiation incident on the silicone gel coating and semiconductor chip.

12. The system of claim 11 further comprising:
a bus coupled to the control unit and the electronic device;
a memory coupled to the bus;
input/output circuitry coupled to the bus; and
a wireless interface coupled to the bus.

13. The system of claim 11 wherein the semiconductor chip further comprises:
a first semiconductor layer;
an insulating layer formed on the first semiconductor layer;
a second semiconductor layer formed on the insulating layer, the second semiconductor layer including a first surface adjoining the insulating layer and a second surface opposite the first surface; and
trench-isolation structures formed in the second semiconductor layer, the trench-isolation structures extending through the second semiconductor layer from the first surface to the second surface to form a plurality of electrically isolated cells in the second semiconductor layer.

14. The system of claim 13 further comprising a plurality of electronic components, each of the electronic components being formed in a separate one of the cells.

15. A method, comprising:
bonding a first surface of a semiconductor chip to a substrate, the semiconductor chip including a second surface opposite the first surface and side surfaces extending between the first and second surfaces;
forming a package structure on the bonded semiconductor chip and substrate, the package including a cavity and the second surface of the semiconductor chip being exposed within the cavity; and
coating the second and side surfaces of the semiconductor chip in the cavity with a layer of silicone gel configured to protect the semiconductor chip from ionizing radiation, the layer of silicone gel being the only layer in the package structure configured to protect the semiconductor chip from ionizing radiation.

16. The method according to claim 15 wherein coating the semiconductor chip with the layer of silicone gel in the cavity comprises coating the semiconductor chip with a layer of silicone gel including hydrogen in the silicone gel.

17. The method according to claim 16 wherein coating the semiconductor chip in the cavity with the layer of silicone gel comprises forming the layer of silicone gel under low-pressure conditions to reduce the formation of bubbles in the gel.

18. The method according to claim 17 wherein forming the layer of gel under low-pressure conditions further comprises forming the layer of gel inside the cavity in the presence of a pressure of approximately 50 mbar.

* * * * *